US009444374B2

(12) United States Patent
Mühlbauer

(10) Patent No.: US 9,444,374 B2
(45) Date of Patent: Sep. 13, 2016

(54) CONVERTER FOR AN ELECTRICAL MACHINE AND METHOD FOR CONTROLLING A POWER CIRCUIT BREAKER

(75) Inventor: Klaus Mühlbauer, Regensburg (DE)

(73) Assignee: FEAAM GMBH, Neubiberg (DE)

( * ) Notice: Subject to any disclaimer, the term of this patent is extended or adjusted under 35 U.S.C. 154(b) by 381 days.

(21) Appl. No.: 14/005,346

(22) PCT Filed: Mar. 12, 2012

(86) PCT No.: PCT/DE2012/100062
§ 371 (c)(1),
(2), (4) Date: Feb. 26, 2014

(87) PCT Pub. No.: WO2012/122978
PCT Pub. Date: Sep. 20, 2012

(65) Prior Publication Data
US 2014/0159630 A1    Jun. 12, 2014

(30) Foreign Application Priority Data
Mar. 16, 2011    (DE) .................. 10 2011 014 165

(51) Int. Cl.
| H02P 6/14 | (2016.01) |
| H02P 6/00 | (2016.01) |
| H02M 1/088 | (2006.01) |
| H03K 17/081 | (2006.01) |
| H03K 17/12 | (2006.01) |
| H02M 1/32 | (2007.01) |
| H03K 17/08 | (2006.01) |

(52) U.S. Cl.
CPC ............. H02P 6/001 (2013.01); H02M 1/088 (2013.01); H03K 17/08104 (2013.01); H03K 17/122 (2013.01); H02M 2001/327 (2013.01); H03K 2017/0806 (2013.01)

(58) Field of Classification Search
USPC ............... 318/400.27, 400.26, 400.29, 801, 318/400.12; 363/131, 132, 16, 17, 21.14, 363/44, 96
See application file for complete search history.

(56) References Cited

U.S. PATENT DOCUMENTS

| 4,545,464 A | * | 10/1985 | Nomura | ............ B66B 1/30 187/296 |
| 7,242,113 B2 | | 7/2007 | Oumaru et al. | |
| 7,808,299 B2 | | 10/2010 | Mao et al. | |
| 2003/0038615 A1 | | 2/2003 | Elbanhawy | |
| 2003/0214770 A1 | | 11/2003 | Schimanek | |
| 2007/0171691 A1 | | 7/2007 | Ashizawa | |
| 2008/0316777 A1 | | 12/2008 | Hyvarinen | |

FOREIGN PATENT DOCUMENTS

| CN | 101499473 A | | 8/2009 | |
| DE | 10 2004 006 753 A1 | | 1/2005 | |
| DE | 102005016440 | * | 10/2006 | ............. H02M 1/08 |
| DE | 102005016440 A1 | | 10/2006 | |
| DE | 10 2008 052 144 A1 | | 4/2010 | |
| EP | 961379 A2 | | 12/1999 | |
| EP | 1926212 A1 | | 5/2008 | |
| JP | 2007-074771 A | | 3/2007 | |
| JP | 2007074771 A | * | 3/2007 | |

* cited by examiner

*Primary Examiner* — Jorge L Carrasquillo
(74) *Attorney, Agent, or Firm* — McDermott Will & Emery LLP

(57) ABSTRACT

The present invention specifies a converter for an electrical machine. A power circuit breaker (T1) comprises at least two semiconductor elements (9, 10) connected to one another to form said power circuit breaker. At least one control circuit (C1, C2, 14) is associated with the at least one power circuit breaker (T1) and is connected to a respective control input of each of the at least two semiconductor components (9, 10) in order to selectively switch the same on and off by means of respective switching signals (S1, S2). The switching signals (S1, S2) are generated on the basis of switching losses and conduction losses of the power circuit breaker (T1).

12 Claims, 3 Drawing Sheets

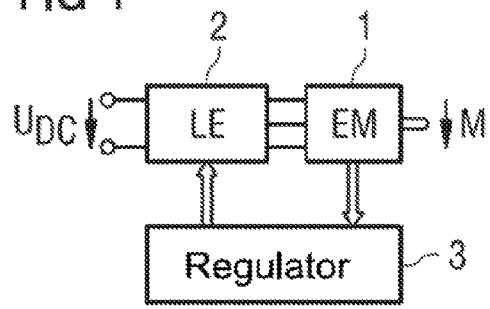
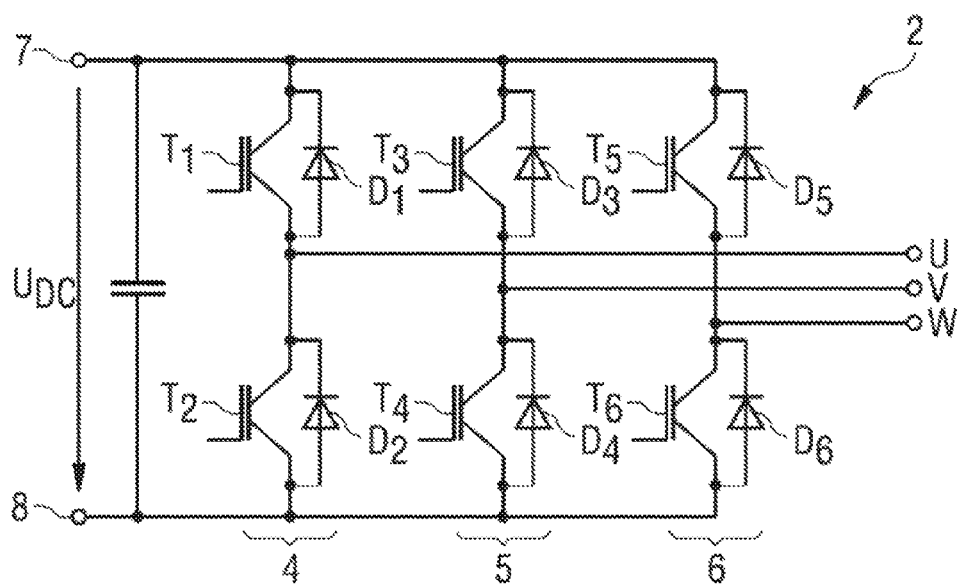
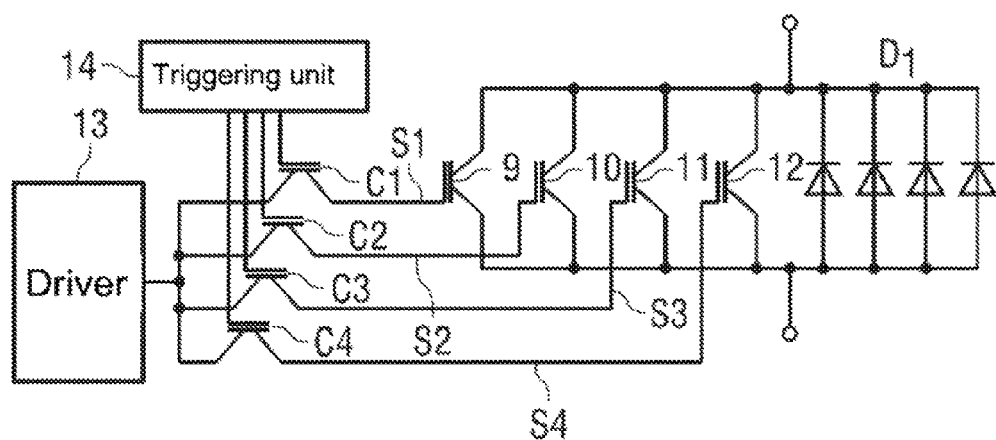

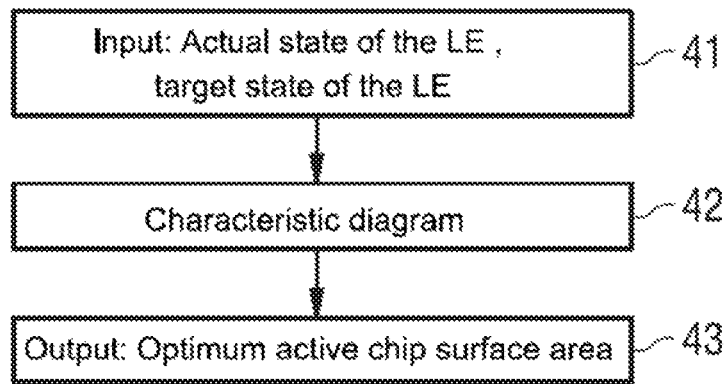
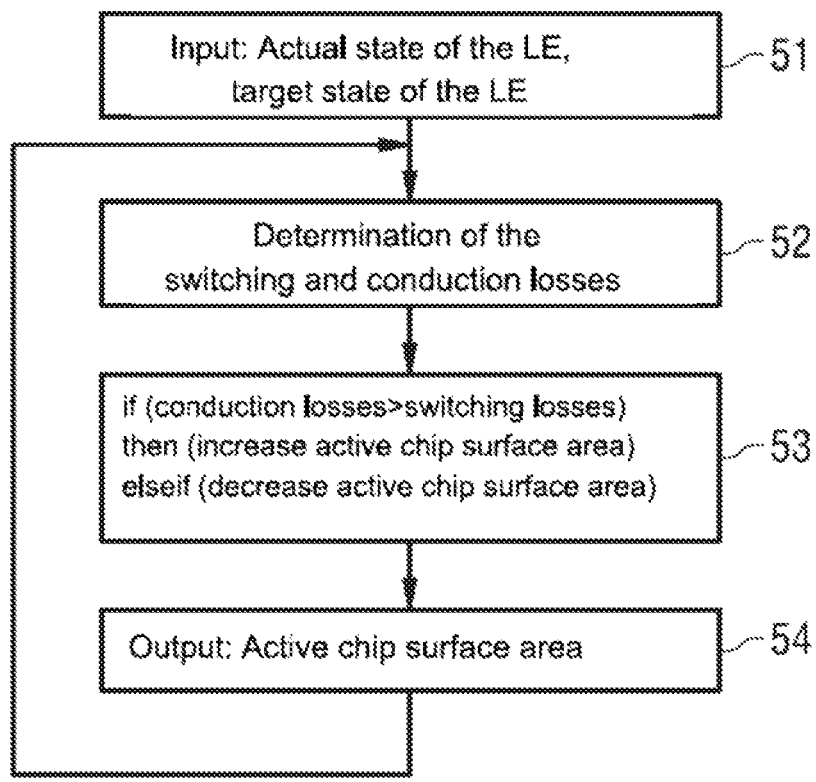

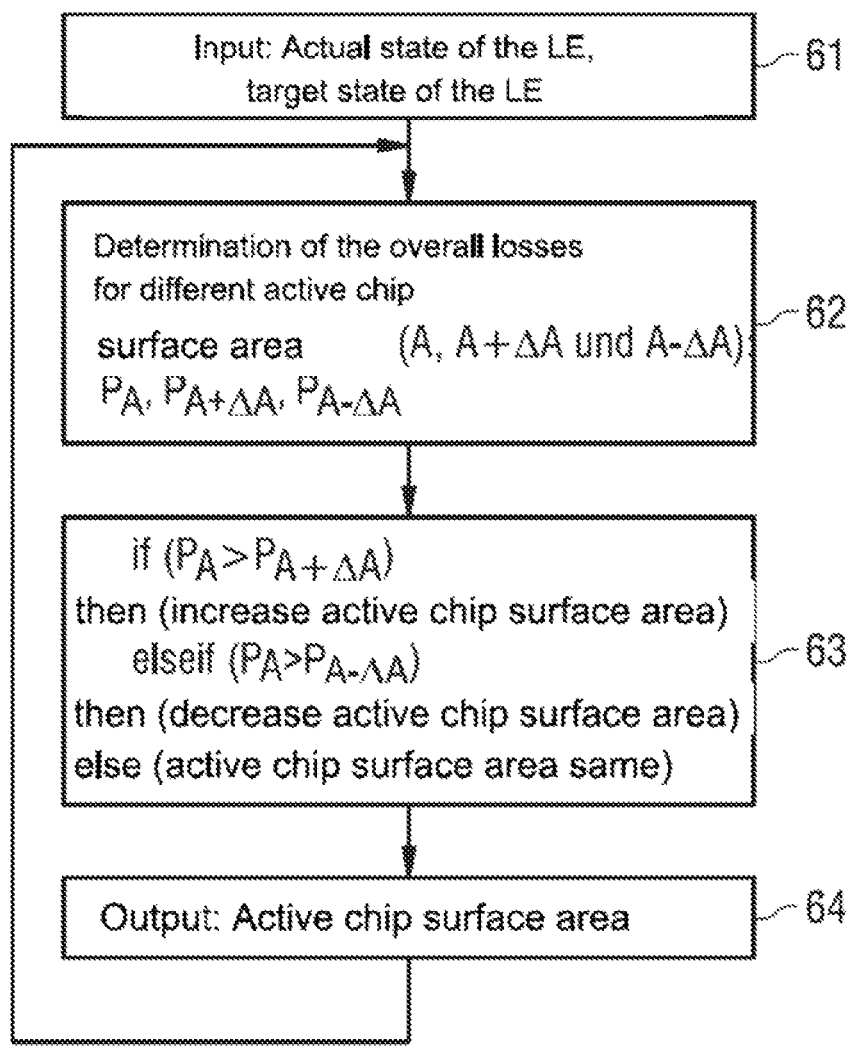

CONVERTER FOR AN ELECTRICAL MACHINE AND METHOD FOR CONTROLLING A POWER CIRCUIT BREAKER

The present invention concerns a converter for an electrical machine and a method for controlling a power circuit breaker.

In order to operate, three-phase machines require an alternating current, the amplitude and frequency of which can preferably adjusted variably. A power electronics unit, which is fed by a DC voltage, is provided for this purpose. For example, the DC voltage may be converted into the AC voltage that is variable with respect to amplitude and frequency via pulse-width modulation using a converter. The terms power electronics unit and converter will be used synonymously in the present case. The power electronics unit provides a nominal voltage specified by the regulation to the terminals of the electrical machine. For a multi-phase electrical machine, a corresponding number of phases are provided by the power electronics unit. The regulation determines the setpoint value based on the measured parameters of the electrical machine such as voltage and current.

If the electrical machine has a three-phase design, the power electronics unit comprises three half-bridges, each comprising a power circuit breaker. The power semiconductors are switched cyclically on and off in order to convert the DC voltage into an AC voltage. In operation, electrical losses occur, including conduction losses and switching losses. Conduction losses are caused by the fact that the power circuit breaker does not behave with ideally low resistance when switched on, i.e. has an on-state resistance different from 0. For example, the power circuit breaker may have a transient resistance dependent nonlinearly on the current flow.

Grounds for switching losses, on the other hand, are charge carriers present in the power circuit breaker, which must be reversed during the switching process. In particular, switching losses are dependent on the current to be switched, on the DC voltage, on the frequency and on the temperature of the power circuit breaker.

The problem of the present invention is to specify a converter for an electrical machine that enables an improvement of the efficiency, particularly in the partial-load range of the electrical machine. An additional problem of the invention is to specify a method for controlling a power circuit breaker in which the efficiency is improved.

The problem is solved with the subject matter of the independent claims. Configurations and refinements are specified in the respective dependent claims.

In one embodiment, a converter for an electrical machine is specified. It comprises at least one power circuit breaker. The power circuit breaker comprises two semiconductor components connected to one another to form the power circuit breaker. At least one control circuit is associated with the at least one power circuit breaker, and is connected to a control input of each of the at least two semiconductor components. In this way it is possible to switch the semiconductor components on and off selectively and independently of one another by means of respective switching signals. The switching signals are generated depending on switching losses and conduction losses of the power circuit breaker.

With the proposed principle, it is possible to actually change the active chip surface area of the power circuit breaker. The active chip surface area of the power circuit breaker modifies its conduction losses and switching losses.

The overall losses, which comprise switching losses and conduction losses, can be minimized by activating the most favorable number of semiconductor components and deactivating the remaining semiconductor components in each case. Only the respectively active semiconductor components carry and switch current on the load side.

In this way, it is possible to significantly reduce the electrical losses of the power electronics, particularly in partial load operation. This in turn improves the efficiency.

In one embodiment of the proposed principle, the respective characteristic curves of the switching losses and conduction losses of the power circuit breaker are available over the entire operating range of the electrical machine and are stored in a storage means. The control circuit comprises the storage means. The switching signals are generated on the basis of an evaluation of these characteristic curves, wherein the sum of the electrical losses, which include the conduction losses and the switching losses, is minimized for the respective operating state of the machine.

In one embodiment, a characteristic curve representing the conduction losses is inversely proportional in a first approximation to the total active chip surface area of the semiconductor components in the at least one power circuit breaker. The characteristic curve representing the switching losses is approximately proportional to the sum of the active chip surface areas of the semiconductor components in the at least one power circuit breaker. The switching signals are generated in such a manner that the overall losses of the power circuit breaker, which comprise the conduction losses and the switching losses are minimal in each case. This means that the active transistor surface area of the power circuit breakers can be varied according to the respective power requirement of the electrical machine.

The characteristic curves representing the conduction losses and the switching losses can be stored in a characteristic diagram, for example, or can be calculated in operation by means of a computing unit and a predetermined calculation rule.

A diode can be associated with each power circuit breaker. This diode is also referred to as a freewheel diode. The diode is preferably connected in parallel to the power circuit breaker.

Just as the power circuit breaker is subdivided into a plurality of parallel-connected semiconductor components, the respective diode can correspondingly be subdivided into a plurality of diode components.

The control circuit preferably comprises a plurality of control switches, each semiconductor component being assigned one control switch. The respective control circuit is used for individually switching the associated semiconductor component on and off The control circuits are connected on the load side between a driver and a control input of the semiconductor and are connected on the control side to a triggering unit. The driver can provide pulse width-modulated signals for example, with which a variable AC voltage can be generated.

Alternatively, a driver can be assigned to each semiconductor component for driving it and can in turn be individually switchable on and off by the control circuit via control switches.

The semiconductor components of the power circuit breaker may be IGBTs, Insulated Gate Bipolar Transistors, for example. Alternatively, other power semiconductors such as MOSFETs or JFETs can also be used.

The plurality of semiconductor components comprised by the power circuit breaker, preferably connected in parallel to one another, can be of equal size, for example, or can be gradated in a binary manner and activated by a corresponding code.

Combinations are also possible, e.g. a rough adjustment with binary-gradated semiconductor components and a fine adjustment with equal-sized semiconductor components. The size or gradation relates in each case to the active chip surface area of the semiconductor components, which ultimately determines the conduction and switching losses.

To drive a three-phase machine, the converter can comprise a total of six power circuit breakers respectively arranged in three half-bridges and each comprising a series connection of two power circuit breakers. A smoothing capacitor is connected on the input side to this power electronics unit, for example. A rectifier may be connected upstream thereof, so that the capacitor is used as a DC link capacitor.

In one example, a method according to the proposed principle comprises driving a power circuit breaker that comprises a plurality of parallel-connected semiconductor components. In a given operating state, the conduction losses of the power circuit breaker and the switching losses of the power circuit breaker are determined in this case or have been determined in advance and stored in a characteristic diagram or memory. The conduction losses are compared to the switching losses for the respective operating state. Individual semiconductor components of the power circuit breaker are activated or deactivated depending on the result of the comparison.

In this way it is possible to keep the overall losses in the power circuit breaker as small as possible over the entire operating range.

For example, the active chip surface area of the power circuit breaker can be increased if the conduction losses are greater than the switching losses, or reduced if the conduction losses are less than nor equal to the switching losses. The active chip surface area of the semiconductor components is determined from the sum of the chip surface areas comprised by the circuit and activated in the respective operating state. The respectively deactivated semiconductor components contribute nothing in practical terms to the conduction and switching losses at any given time.

The invention will be described in detail below for several embodiments with reference to figures. Therein:

FIG. 1 shows the fundamental structure of an electric drive system according to the proposed principle, FIG. 2 shows an exemplary structure of the power electronics unit according to the proposed principle, FIG. 3 shows an embodiment of a converter according to the proposed principle as could be used in FIGS. 1 and 2, FIG. 4 shows an embodiment of a sequence diagram for driving a power circuit breaker according to the proposed principle, FIG. 5 shows another embodiment of a sequence diagram for driving a power circuit breaker according to the proposed principle, and FIG. 6 shows an additional embodiment of a sequence diagram for driving a power circuit breaker according to the proposed principle.

FIG. 1 shows a general structure of an electrical drive with an electrical machine 1 and a converter 2. The converter 2 can also be referred to as a power electronics unit. A regulator 3 is also provided. The electrical machine 1 in the present example is a three-phase machine, which is supplied by three electrical phases U, V, W. On the output side, a rotating shaft is formed on the electrical machine. The electrical machine 1 can operate as a generator or a motor. Accordingly, the converter operates as a rectifier or an inverter. In motor operation, the three phases U, V, W are provided from a DC voltage $U_{DC}$ by means of the converter 2. The DC voltage is converted by means of a pulse width modulation into a variable AC voltage, which can be adjusted variably with respect to amplitude and frequency in the three phases U, V, W. The regulator 3 detects measured parameters of the electrical machine 1 such as current and voltage in all three phases U, V, W and determines setpoint values for the voltage and frequency of the three phases U, V, W.

FIG. 2 shows the converter 2 of FIG. 1 in an example. A smoothing capacitor on the input side is shown. It is used, for example, for smoothing upper harmonics that can result from clocked operation of the power switches T1-T6 in the converter.

The converter comprises three half-bridges 4, 5, 6. Each half-bridge 4, 5, 6 comprises a series connection of two power circuit breakers T1, T2; T3, T4; T5, T6, each comprising at least one transistor. A diode is connected back-to-back to each power circuit breaker T1, T2, T3, T4, T5, T6. The series connections of the power circuit breakers forming a respective half bridge, are in series with respect to their controlled paths and are connected between a supply potential terminal 7 and a reference potential terminal 8. The DC voltage $U_{DC}$ falls between these potentials. The three output terminals of the converter are formed at the respective central tapping nodes between the series-connected power circuit breakers of the half bridges 4, 5, 6, at which terminals the electrical phases U, V, W that are adjustable with respect to the level of the voltage and frequency can be tapped.

Back-to-back connection of the diodes means in the present case that the diodes are connected with their polarity opposite to the polarity of the DC voltage $U_{DC}$.

By suitable switching of the power circuit breakers T1-T6, the DC voltage $U_{DC}$ is converted into a three-phase AC voltage U, V, W. A pulse width modulation is used in this regard. The power switches T1-T6 shown each comprise at least one power semiconductor, referred to here as a semiconductor component, constructed as an IGBT, insulated gate bipolar transistor. The power circuit breakers T1-T6 are also referred to as valves in power electronics. Each valve is supplied with electrical energy via its own driver electronics unit, as will later be explained. The capacitance present between the gate and emitter contacts of the IGBT is charged to 15 V, for example, for switching on the power semiconductor and is discharged or set to ground potential by −15 V for switching off the power semiconductor. As FIG. 2 shows, six driver components, with which the six valves are associated, are required for a three-phase power electronics unit.

Due to their structure as semiconductors, the valves do not behave with ideally low-impedance in the on state. They have an on-state resistance different from zero. The power circuit breakers have a transient resistance depending non-linearly on the current flow. This property also applies to the diodes.

Due to the clocked operation of the power electronics, switching losses also occur, which are caused by charge reversal processes of the charge carriers present in the power circuit breakers. The switching losses depend primarily on the level of the current to be switched, the DC voltage of the DC link, the switching frequency and the temperature of the semiconductor chip.

The DC link voltage is considered to be the DC voltage at terminals 7, 8, because it is typically generated from an AC voltage of an AC voltage power system. For this purpose, an additional converter can be connected between the electrical supply network and the terminals 7, 8.

Conduction losses and switching losses lead to heating of the power circuit breakers. The heat arising must be dissipated by a thermal coupling to a cooling system, so that a permissible maximum temperature in the power semiconductors is not exceeded and thus a destruction thereof can be avoided.

FIG. 3 shows the embodiment of a valve in accordance with FIG. 2. The first valve comprising the power circuit breaker T1 and the parallel-connected diode D1 is shown for the sake of example. The other power circuit breakers can likewise be constructed as shown for the sake of example in FIG. 3.

The power circuit breaker in FIG. 3 in this example comprises four parallel-connected semiconductor components 9, 10, 11, 12. They are each implemented as an IGBT, i.e. a bipolar transistor with an insulated control electrode (gate), the emitter terminals and all collector terminals being connected to one another. The gate terminals of the semiconductor components 9-12 can be triggered individually by means of respective switching signals S1, S2, S3, S4. The diode D1 comprises four parallel-connected diodes. The gate terminals of the semiconductor components 9-12 are connected via control switches C1, C2, C3, C4 to one output of a driver 13. Control terminals C1, C2, C3, C4 of the control switches are individually connected to a triggering unit 14. The triggering unit 14 can be driven by the regulator 3 based on the actual parameters of the electrical machine, for example. This triggering will be further explained below.

In alternative embodiments and because diodes cannot be individually driven, and thus a variation of the active chip surface area is not possible, the freewheel path can also be realized by a single discrete diode with four times the chip surface area.

With the proposed subdivision of the power circuit breaker into several semiconductor elements, it is possible to vary the number of transistors to be switched and their chip surface area. Therefore transistors 9-12 of identical chip surface area can be used. Alternatively, the transistors 9-12 can have different chip surface areas, gradated in binary form, for example. It is also alternatively possible to adapt the chip surface areas of the semiconductor components 9-12 to the probability of the presence of different, definable operating points.

In relation to the above-explained conduction losses of the power circuit breakers, it was already noted that they have a transient resistance dependent nonlinearly on the current flow. The conduction characteristics of the power circuit breakers can be approximated by tangents and thus calculated analytically. It is assumed in that case that the machine will react with a sinusoidal current if a sinusoidal voltage is applied, which is permissible for sinusoidally supplied machines. Thus it is possible to determine a characteristic curve representing the conduction losses that is to a good approximation inversely proportional to the sum of the active chip surface areas of the semiconductor components 9-12 in the power circuit breaker T1.

A characteristic diagram regarding the switching losses as a function of current and temperature can be correspondingly provided, and the switching losses can be determined therewith. The influence of the switching frequency and the DC link voltage can be approximated linearly. The characteristic curve representing the switching losses is proportional in a first approximation to the sum of the active chip surface areas of the semiconductor components 9-12 of the power circuit breaker T1.

In a conventional power electronics unit, the efficiency drastically decreases in the partial load range with decreasing power. While the conduction losses decrease disproportionally for a low electric power machine, the switching losses do not decrease to the same extent as the drive power. This is a main cause for the deterioration of the efficiency of power electronics in the partial load range. This problem is eliminated in the present case. The number of parallel-connected semiconductor components per valve is not constant over the entire operating range of the electrical machine, but is instead varied load-dependently during operation. The switching losses are proportional to the charge carriers for charge reversal in the semiconductor component. The charge carriers are proportional to the chip surface area of the semiconductor component. A smaller active chip surface area thus also means lower switching losses. With this approach, the conduction losses do increase somewhat for an identical phase current due to the reduction of the active chip surface, but the increase in the partial load range has a markedly smaller influence than the reduction of the switching losses.

In the practical structure, the described triggering method has no effect in the power path of the power electronics or on the driver modules. It is only necessary to install additional switches with low power capability, namely the control switches C1-C4, upstream of the semiconductor components of the power circuit breaker. A triggering unit for the additional switches C1-C4 is also necessary; it is provided with the reference number 14 and, for example, has an algorithm for optimizing the overall losses of the power electronics depending on the operating state. Alternatively, characteristic diagrams can be stored therein. Nevertheless, the basic structure of an electrical machine driven in accordance with FIG. 1 and the power electronics in accordance with FIG. 2 can be retained unchanged with the proposed principle, which promises a cost-effective implementation.

The proposed solution does not require any additional passive components or any additional power semiconductors. The described principle can be operated with the configuration in accordance with FIG. 1 selectively by current regulation or speed regulation. Because most drives are not continuously operated at the point of maximum power or rated power, an improved efficiency in the partial load range is particularly advantageous. The overall efficiency of the machine can be markedly increased in that way.

With the adaptation of a triggering algorithm in the triggering unit 14 for controlling the active chip surface, there can be an adjustment of the transistor configuration in order to achieve the optimum efficiency of the power electronics. The thermal behavior of the transistors can optionally also be included. For example, the same transistors can always be switched on in case the load increases. The nonuniform heat generation that would thereby occur on a power electronics module that can comprise the power electronics in accordance with FIG. 3 would be countered by a nonuniform cooling. Alternatively, an equally distributed or random switching-on would also be possible.

The driver losses occurring in the converters in addition to the conduction and switching losses are ignored for the present analysis.

It is assumed that the switching frequencies of the power circuit breakers lie in a range up to 20 kHz for example.

The mode of operation of the proposed principle for the triggering unit 14 will be described in further detail with reference to exemplary sequence diagrams. As already indicated, the triggering unit 14 can comprise a hardware-based or a software-based implementation for loss-optimized determination of the active chip surface area. This can be realized by one or more characteristic diagrams and/or an algorithm. FIG. 4 shows this for one embodiment. The state parameters of the power electronics serve as the input parameters in the first step 41. For stationary operation, actual parameters, i.e. actual values, are sufficient. Other setpoint values, that is to say, the desired state of a transient transition, can additionally be used. In a realization with one or more characteristic diagrams, the optimum chip surface area is determined with the aid of the characteristic diagrams directly in step 42. The output of the triggering as realized in step 43 determines the optimum size of the active chip surface area, and defines the selection of which of the semiconductor components 9-12 will be activated and which will be deactivated. The other valves, which have a corresponding structure in accordance with FIG. 3, are triggered accordingly.

If the active chip surface is alternatively determined by means of an algorithm, two possibilities are provided. In the first implementation possibility, which is shown in FIG. 5, the switching and conduction losses are determined in step 52, starting from the input parameters determined in step 51. The switching and conduction losses are determined separately from one another. This determination can be based on characteristic diagrams or calculations. In the next step 53, it is decided based on the results of step 52 whether and with what sign the active chip surface area will be modified, i.e. whether it will be reduced, enlarged or retained. If the switching losses are greater than the conduction losses, the chip surface area is reduced. On the other hand, if the switching losses are less than the conduction losses, the chip surface area is increased. The active chip surface area is modified in step 54. Thereafter a determination of the switching losses and, independently thereof, the conduction losses, is performed for the modified chip surface area, so that an iterative process results. The optimum active chip surface area is achieved after several iterations. This can be referred to as successive approximation. The prerequisite is that the input parameters only change slowly relative to the iteration speed.

An alternative to this procedure is shown in FIG. 6. The input parameters are determined in the first step 61, as was already described for FIG. 4 based on step 41 and for FIG. 5 based on step 51. In a subsequent step 62, the overall losses for different active chip surface areas are calculated; in particular the overall losses with the current chip surface area A, an enlarged chip surface area A+ΔA and a reduced chip surface area A−ΔA are calculated. If the overall losses with the increased chip surface area are smaller than those with the current chip surface area, the active chip surface area is increased. On the other hand, if the overall losses with the smaller chip surface area are smaller relative to the current chip surface area, the current chip surface area is reduced, steps 63, 64. Then there is again a determination of the overall losses for the modified active chip surface area in step 62. Here as well, an iterative process is provided, in which the optimum active chip surface area is adjusted with sufficiently frequent repetition. The prerequisite that the input parameters only vary slowly relative to the iteration speed also applies here.

In both the embodiment of FIG. 5 and that of FIG. 6, a rounding to the possible gradation of the active chip surface area due to the discrete number of semiconductor components must be performed, wherein the rounding is to be carried out so that a safe operation is guaranteed. With a characteristic diagram-based method according to FIG. 4 on the other hand, such a rounding or the corresponding quantification can already be incorporated into the characteristic diagrams.

LIST OF REFERENCE NUMBERS

1 Electrical machine
2 Converter
3 Regulator
4 Half-bridge
5 Half-bridge
6 Half-bridge
7 DC voltage terminal
8 Reference voltage terminal
9 Semiconductor component
10 Semiconductor component
11 Semiconductor component
12 Semiconductor component
13 Driver
14 Triggering unit
C1 Control switch
C2 Control switch
C3 Control switch
C4 Control switch
S1 Switching signal
S2 Switching signal
S3 Switching signal
S4 Switching signal
41 Determination of the input parameters
42 Determination of the losses according to characteristic diagram
43 Adjusting the most favorable chip surface area
51 Determination of input parameters
52 Determination of the switching and conduction losses
53 Determination of the modification of the chip surface area
54 Modification of the chip surface area
61 Determination of input parameters
62 Determination of the overall losses
63 Determination of the modification of the chip surface area
64 Modification of the chip surface area

The invention claimed is:

1. A converter for an electrical machine, comprising:
at least one power circuit breaker comprising at least two semiconductor components connected to form the power circuit breaker; and
at least one control circuit, which is associated with the at least one power circuit breaker and which is connected to a respective control input of the at least two semiconductor components in order to selectively switch the semiconductor components on and off by means of respective switching signals,
wherein the switching signals are generated on the basis of switching losses and on the basis of conduction losses of the power circuit breaker,
wherein the at least one control circuit comprises storage means in which respective characteristic curves of the switching losses and conduction losses for the power circuit breaker in a partial load range of the electrical machine are stored,
wherein the switching signals are generated depending on these characteristic curves,
wherein the characteristic curve representing the conduction losses is inversely proportional to the sum of the active chip surface areas of the semiconductor components of the at least one power circuit breaker, and wherein the characteristic curve representing the switching losses is proportional to the sum of the active chip surface areas of the semiconductor components of the at least one power circuit breaker, and the switching signals are generated in such a manner that the overall losses of the power circuit breaker are minimal.

2. The converter according to claim 1, wherein the characteristic curves are stored in at least one characteristic diagram.

3. The converter according to claim 1, wherein the characteristic curves are calculated in operation in a computing unit by means of a predetermined calculation rule.

4. The converter according to claim 1, wherein the at least two semiconductor components connected to one another to form the power circuit breaker are connected in parallel to one another.

5. The converter according to claim 1, wherein a diode is associated with each power circuit breaker and is connected in parallel to the power circuit breaker (T1).

6. The converter according to claim 1, wherein the control circuit comprises at least two control switches,
wherein one respective control switch is assigned to each semiconductor component and is used for selectively switching the semiconductor components on and off by means of the respective switching signals, and
wherein the control circuits are connected on a load side between a driver and a control input of the respectively associated semiconductor component and are connected on a control side to a triggering unit.

7. The converter according to claim 1, wherein the semiconductor components are of the insulated gate bipolar transistor type.

8. The converter according to claim 1, wherein the at least two semiconductor components connected to one another to form the power circuit breaker are of equal size.

9. The converter according to claim 1, wherein the at least two semiconductor components connected to one another to form the power circuit breaker have chip surface areas gradated in a binary manner with respect to one another.

10. The converter according to claim 1, which has three half-bridges, wherein each half bridge is associated with one electrical phase and has two respective semiconductor components.

11. A method for driving a power circuit breaker comprising a plurality of parallel-connected semiconductor elements, the method comprising:
determining the conduction losses of the power circuit breaker;
determining the switching losses of the power circuit breaker;
comparing the conduction losses to the switching losses; and
activating or deactivating individual semiconductor elements in the power circuit breaker depending on the comparison result with respective switching signals,
wherein the switching signals are generated depending on stored characteristic curves of the switching losses and conduction losses for the power circuit breaker in a partial load range of the electrical machine,
wherein the characteristic curve representing the conduction losses is inversely proportional to the sum of the active chip surface areas of the semiconductor components of the at least one power circuit breaker,
wherein the characteristic curve representing the switching losses is proportional to the sum of the active chip surface areas of the semiconductor components of the at least one power circuit breaker, and
wherein the switching signals are generated in such a manner that the overall losses of the power circuit breaker are minimal.

12. The method according to claim 11, wherein the active chip surface area of the power circuit breaker is increased if the conduction losses are greater than the switching losses, and wherein the active chip surface area of the power circuit breaker is decreased if the conduction losses are less than or equal to the switching losses.

* * * * *